US008227301B2

(12) United States Patent
Anderson et al.

(10) Patent No.: US 8,227,301 B2
(45) Date of Patent: Jul. 24, 2012

(54) SEMICONDUCTOR DEVICE STRUCTURES WITH FLOATING BODY CHARGE STORAGE AND METHODS FOR FORMING SUCH SEMICONDUCTOR DEVICE STRUCTURES

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 12/634,137

(22) Filed: Dec. 9, 2009

(65) Prior Publication Data

US 2010/0087037 A1    Apr. 8, 2010

Related U.S. Application Data

(62) Division of application No. 11/858,148, filed on Sep. 20, 2007, now abandoned.

(51) Int. Cl.
*H01L 23/49* (2006.01)

(52) U.S. Cl. ............. 438/149; 257/353; 257/E29.105; 438/479

(58) Field of Classification Search .............. 257/327, 257/347–354; 438/157, 149, 479
See application file for complete search history.

(56) References Cited

U.S. PATENT DOCUMENTS

| | | |
|---|---|---|
| 6,713,810 B1 | 3/2004 | Bhattacharyya |
| 6,912,150 B2 | 6/2005 | Portman et al. |
| 6,917,078 B2 | 7/2005 | Bhattacharyya |
| 6,925,006 B2 | 8/2005 | Fazan et al. |
| 6,930,918 B2 | 8/2005 | Fazan et al. |
| 6,934,186 B2 | 8/2005 | Fazan et al. |
| 6,937,516 B2 | 8/2005 | Fazan et al. |
| 6,969,662 B2 | 11/2005 | Fazan et al. |
| 6,980,461 B2 | 12/2005 | Portmann et al. |
| 6,982,457 B2 | 1/2006 | Bhattacharyya |
| 6,982,918 B2 | 1/2006 | Fazan et al. |
| 7,026,690 B2 | 4/2006 | Bhattacharyya |
| 7,042,052 B2 | 5/2006 | Bhattacharyya |
| 7,061,050 B2 | 6/2006 | Fazan et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,184,298 B2 | 2/2007 | Fazan et al. |
| 7,187,581 B2 | 3/2007 | Ferrant et al. |
| 7,352,037 B2 | 4/2008 | Kim et al. |
| 2002/0050614 A1 | 5/2002 | Unnikrishnan |
| 2004/0150071 A1 | 8/2004 | Kondo et al. |
| 2004/0228168 A1 | 11/2004 | Ferrant et al. |

(Continued)

OTHER PUBLICATIONS

Okhonin, S. et al., "A Capacitor-Less 1T-DRAM Cell", IEEE Electron Device Letters, vol. 23, No. 2, Feb. 2002 (pp. 85-87).

(Continued)

*Primary Examiner* — Kiesha Bryant
*Assistant Examiner* — Mark Tornow
(74) *Attorney, Agent, or Firm* — Wood, Herron & Evans, LLP; Anthony J. Canale

(57) ABSTRACT

Semiconductor device structures including a semiconductor body that is partially depleted to define a floating charge-neutral region supplying a floating body for charge storage and methods for forming such semiconductor device structures. The width of the semiconductor body is modulated so that different sections of the body have different widths. When electrically biased, the floating charge-neutral region at least partially resides in the wider section of the semiconductor body.

10 Claims, 10 Drawing Sheets

U.S. PATENT DOCUMENTS

| | | |
|---|---|---|
| 2005/0017240 A1 | 1/2005 | Fazan |
| 2005/0023613 A1 | 2/2005 | Bhattacharyya |
| 2005/0269629 A1* | 12/2005 | Lee et al. ............... 257/327 |
| 2006/0091462 A1* | 5/2006 | Okhonin et al. ........... 257/347 |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2007/0023833 A1 | 2/2007 | Okhonin et al. |
| 2007/0058427 A1 | 3/2007 | Okhonin et al. |
| 2007/0063261 A1* | 3/2007 | Chen et al. ............... 257/316 |
| 2007/0064489 A1 | 3/2007 | Bauser |
| 2007/0085140 A1* | 4/2007 | Bassin ................... 257/353 |
| 2007/0097751 A1 | 5/2007 | Popoff et al. |
| 2007/0190709 A1* | 8/2007 | Cho et al. ............... 438/157 |
| 2007/0278572 A1* | 12/2007 | Ban et al. ............... 257/341 |
| 2008/0149984 A1* | 6/2008 | Chang et al. ............. 257/314 |

OTHER PUBLICATIONS

Halfhill, Tom R. "Z-Ram Shrinks Embedded Memory", Oct. 25, 2005 Microprocessor Report (4 pages).

I. Ban et al., "Floating Body Cell with Independently-Controlled Double Gates for High Density Memory", IEDM 2006 (4 pages).

Innovative Silicon, Inc., "Technology Overview", Dec. 2006 (62 pages).

\* cited by examiner

SEMICONDUCTOR DEVICE STRUCTURES WITH FLOATING BODY CHARGE STORAGE AND METHODS FOR FORMING SUCH SEMICONDUCTOR DEVICE STRUCTURES

CROSS-REFERENCE TO RELATED APPLICATIONS

This application is a divisional of application Ser. No. 11/858,148, filed Sep. 20, 2007, which is hereby incorporated by reference herein in its entirety.

FIELD OF THE INVENTION

The invention relates to semiconductor device structures and methods and, in particular, to semiconductor device structures having floating body charge storage permitting operation as a memory cell and methods of forming such semiconductor device structures.

BACKGROUND OF THE INVENTION

Dynamic random access memory (DRAM) devices are the most commonly used type of semiconductor memory and, thus, are found in many integrated circuit designs. A generic DRAM device includes a plurality of substantially identical memory cell arrays, a plurality of bit lines, and a plurality of word lines that intersect the bit lines. Each individual memory cell array includes a plurality of memory cells arranged in rows and columns. Each individual memory cell includes a storage capacitor for storing data in the form of charges and an access device, such as a planar or vertical field effect transistor (FET), for allowing the transfer of data charges to, and from, the storage capacitor during read and write operations. Each memory cell in the array is located at the intersection of one of the word lines and one of the bit lines. Either the source or drain of the access device is connected to one of the bit lines and the gate of the access device is connected to one of the word lines.

A different type of dynamic memory, referred to as zero capacitor DRAM or ZRAM, has been developed in which the charge is stored in a charge-neutral floating body of a transistor. Conventionally, the transistor used in a ZRAM device is built using a silicon-on-insulator substrate, which provides a high degree of isolation for the floating body to the substrate.

Fin-type field effect transistors (FinFETs) are low-power, high-speed non-planar devices that can be more densely packed in an integrated circuit than traditional planar transistors. In comparison with traditional planar transistors, the three-dimensional FinFETs offer superior short channel scalability, a reduced threshold voltage swing, higher mobility, and the ability to operate at lower supply voltages.

An integrated circuit that includes FinFETs may be fabricated a silicon-on-insulator (SOI) wafer that includes an active SOI layer of a single crystal semiconductor, such as silicon, a semiconductor substrate, and a buried insulating layer that separates and electrically isolates the semiconductor substrate from the SOI layer. Each FinFET includes a narrow vertical semiconductor body fashioned from the SOI layer. The sidewalls of each FinFET intersect the buried insulating layer. A conductive gate electrode, which intersects a channel of the semiconductor body, is isolated electrically from the semiconductor body by a thin gate dielectric layer. The opposite ends of the semiconductor body, which project outwardly from beneath the gate electrode, are heavily doped to define source and drains that flank the channel. When a voltage exceeding a characteristic threshold voltage is applied to the gate electrode, a depletion/inversion layer is formed in the channel that permits carrier flow between the source and drain (i.e., the device output current).

A FinFET may be operated in two distinct modes contingent upon the characteristics of the depletion layer. A FinFET is considered to operate in a partially-depleted mode when the depletion layer fails to extend completely across the width of the fin body. The undepleted portion of the fin body in the channel, which is electrically conductive, slowly charges as the FinFET is switched to various voltages depending upon its most recent history of use. A FinFET is considered to operate in a fully-depleted mode when the depletion layer extends across the full width of the fin body and there is no charge-neutral region of the body Generally, a fully-depleted FinFET exhibits performance gains in comparison with a FinFET operating in a partially-depleted mode. Specifically, fully-depleted FinFETs exhibit significant reductions in leakage current and dissipate less power into the substrate, which reduces the probability of device overheating. Parasitic capacitances are also greatly reduced in fully-depleted FinFETs, which significantly improves the device switching speed.

What is needed, nevertheless, is a FinFET device construction that operates as a memory cell in which a floating charge-neutral region of the partially-depleted semiconductor body of the FinFET is advantageously used for charge storage.

SUMMARY OF THE INVENTION

An embodiment of the invention is directed to a semiconductor device structure carried on a dielectric layer. The semiconductor device structure comprises a semiconductor body having first and second sidewalls extending to the dielectric layer. The semiconductor body, which is doped with an impurity of a conductivity type, includes a first section at least partially intersected by a gate electrode and a second section. The first section is wider than the second section. The width of the first section and a concentration of the impurity in the first section are selected such that the first section is partially depleted to define a floating charge-neutral region therein when biased by a bias potential applied by the gate electrode.

Another embodiment of the invention is directed to a method of forming a semiconductor structure using a semiconductor-on-insulator substrate having a semiconductor layer, a bulk region of a first conductivity type underlying the semiconductor layer, and a dielectric layer between the semiconductor layer and the bulk region. The method comprises patterning the semiconductor layer to define a semiconductor body with sidewalls extending to the dielectric layer. The semiconductor body has a first section with a first width between the opposite sidewalls and a second section with second width between the opposite sidewalls that is narrower than the first width. The method further comprises introducing an impurity into the first section of the semiconductor body with a first concentration selected in conjunction with the first width such that, when the first section is biased by a bias potential, the first section is partially depleted to define a floating charge-neutral region therein. In an alternative embodiment, the first impurity may also be introduced into the second section of the semiconductor body with a second concentration selected in conjunction with the second width such that, when the second section is biased by the bias potential, the second section is fully depleted.

The semiconductor device structures of the embodiments of the invention may operate with stored-charge retention times, which may lower operation power. Embodiments of the invention rely on a FinFET operating in a partially-depleted mode in which a portion of the semiconductor body of the partially-depleted FinFET is used for charge storage. The state of memory cell is determined by the concentration of charge within an electrically-floating body region resulting from operation in a partially-depleted mode.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1A:
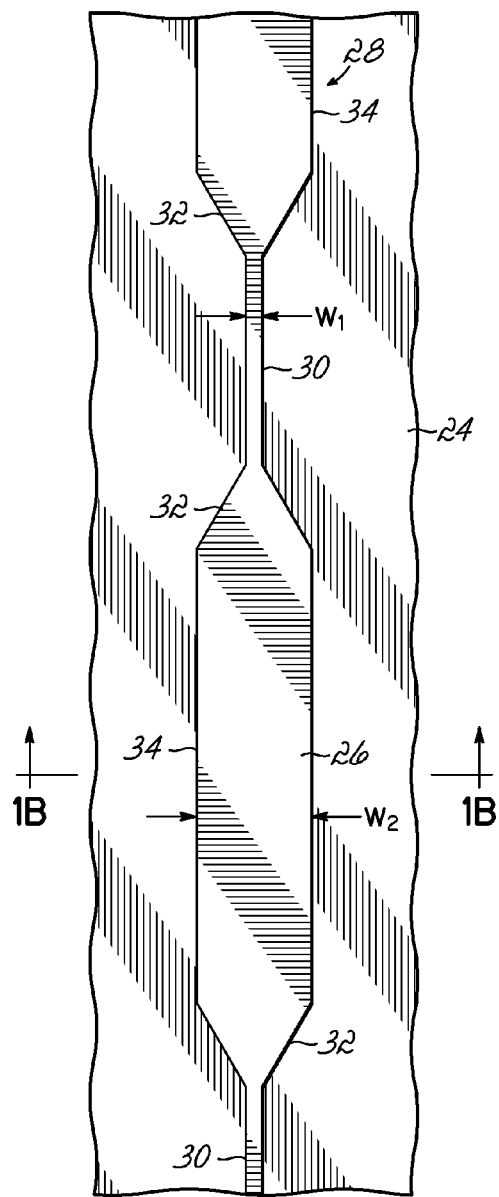
FIG. 1A is diagrammatic top view of a portion of a substrate at an initial fabrication stage of a processing method in accordance with an embodiment of the invention.
Figure 1B:
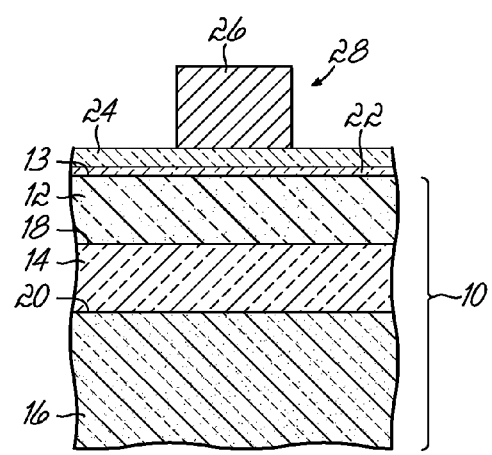
FIG. 1B is a diagrammatic cross-sectional view taken generally along line 1B-1B of FIG. 1A.

With reference to FIGS. 1A and 1B, a semiconductor-on-insulator (SOI) substrate 10 includes a semiconductor layer 12 with a top surface 13, a buried insulating layer 14, and a handle or bulk region 16 separated from the semiconductor layer 12 by the buried insulating layer 14. The semiconductor layer 12 and buried insulating layer 14 are coextensive along a boundary or interface 18. Similarly, the bulk region 16 and buried insulating layer 14 are coextensive along a boundary or interface 20.

The SOI substrate 10 may be fabricated by any suitable conventional technique, such as a wafer bonding and splitting technique. In the representative embodiment, the semiconductor layer 12 is made from a single crystal or monocrystalline silicon-containing material, such as silicon, and the bulk region 16 may likewise be formed from a single crystal or monocrystalline silicon-containing material, such as silicon. The semiconductor layer 12 may be as thin as about 10 nanometers or less and, typically, is in the range of about 5 nanometers to about 150 nanometers, but is not so limited. The thickness of the bulk region 16, which is considerable thicker than the semiconductor layer 12, is not shown to scale in FIG. 1. The buried insulating layer 14 comprises a conventional dielectric material, such as silicon dioxide ($SiO_2$), and may have a thickness in the range of about 50 nanometers to about 150 nanometers, although not so limited.

The top surface 13 of semiconductor layer 12 is covered by a pad stack consisting of first and second pad layers 22, 24. The thinner first pad layer 22 separates the thicker second pad layer 24 from the semiconductor layer 12. The constituent material(s) of pad layers 22, 24 are chosen to etch selectively to the semiconductor material constituting semiconductor layer 12 and to be readily removed at a subsequent stage of the fabrication process. The first pad layer 22 may be $SiO_2$ with a thickness on the order of about 5 nanometers to about 10 nanometers and may be grown by exposing the semiconductor layer 12 to either a dry oxygen ambient or steam in a heated environment or deposited by a conventional deposition process, such as thermal chemical vapor deposition (CVD). The second pad layer 24 may be a conformal layer of silicon nitride ($Si_3N_4$) with a thickness on the order of about 20 nanometers to about 200 nanometers and deposited by a thermal CVD chemical vapor deposition process like low-pressure chemical vapor deposition (LPCVD) or a plasma-assisted CVD process. The first pad layer 22 may operate as a buffer layer to prevent any stresses in the material constituting the second pad layer 24 from initiating the formation of dislocations in the semiconductor material of semiconductor layer 12.

A resist layer 26 is applied on a top surface of pad layer 24 and patterned by a conventional lithography process. The resist layer 26 may be patterned by exposure to radiation, which creates a latent pattern in the constituent resist, and then developing the latent pattern in the exposed resist. The residual portions of the resist layer 26 define a mask that is used to pattern the pad layers 22, 24 and, subsequently, the semiconductor layer 12.

The patterned resist layer 26 includes an array of substantially identical linear features, of which linear feature 28 is representative. Linear feature 28 includes constituent sub-features characterized by graduated or modulated widths. Specifically, linear feature 28 includes relatively narrow sections 30, tapered sections 32, and relatively wide sections 34 joined in continuity with the narrow sections 30 and tapered sections 32. The narrow sections 30 and wide sections 34 are arranged such that each of the relatively wide sections 34 is disposed between a pair of adjacent narrow sections 30. Each narrow section 30 is characterized by a constant width, $W_1$, and each of the wide sections 34 is characterized by a constant width, $W_2$. Each of the tapered sections 32 provides a dimensional transition between the width, $W_1$, of each of the narrow sections 30 and the width, $W_2$, of the adjacent one of the wide sections 34. The widths of the sections 30, 32, 34 are measured in a transverse direction relative to the sidewalls of the linear feature 28.

In an alternative embodiment, the pad stack including pad layers 22, 24 can be omitted such that the patterned resist layer 26 is supported directly on the top surface 13 of the semiconductor layer 12.

Figure 2A:
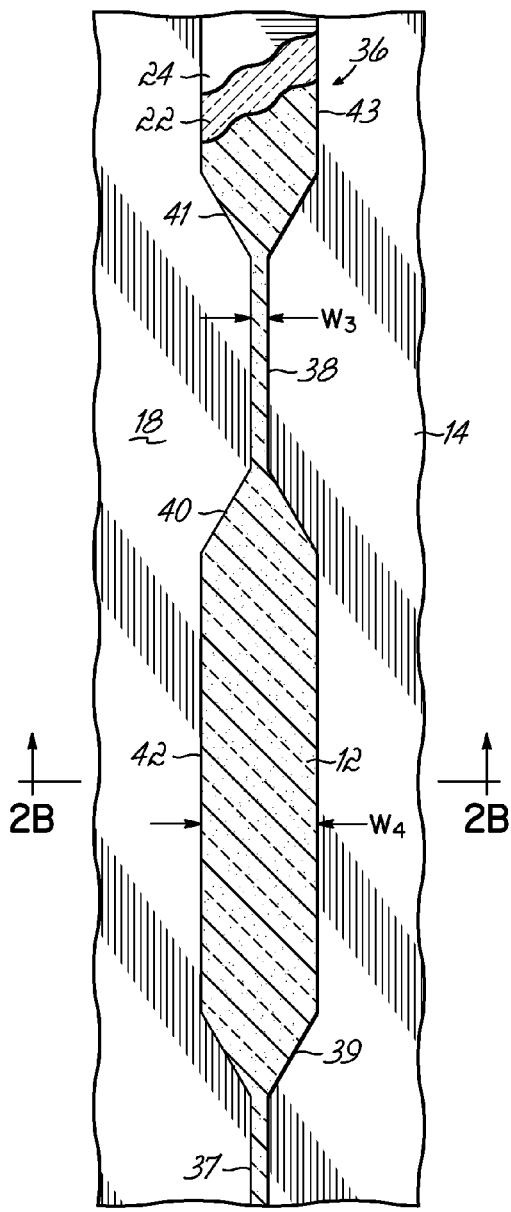
FIG. 2A is diagrammatic top view of the substrate portion at a fabrication stage subsequent to FIG. 1A.
Figure 2B:
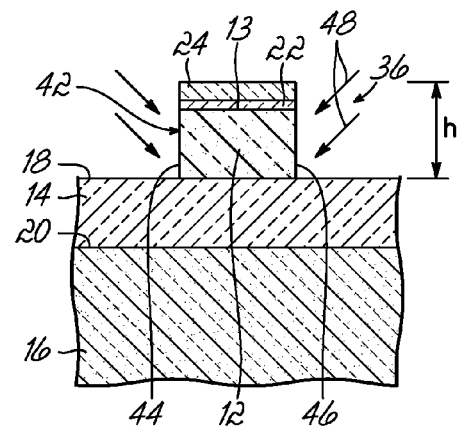
FIG. 2B is a diagrammatic cross-sectional view taken generally along line 2B-2B of FIG. 2A.

With reference to FIGS. 2A and 2B in which like reference numerals refer to like features in FIGS. 1A and 1B, respectively, and at a subsequent fabrication stage, the semiconductor layer 12 is patterned to define a plurality of substantially identical semiconductor fins, of which semiconductor fin 36 is representative, that are distributed across the SOI substrate 10 to reflect the patterned resist layer 26 (FIGS. 1A and 1B). The semiconductor layer 12 may be patterned using a conventional etching process that relies on the patterned resist layer 26 as a mask. In one embodiment, an anisotropic dry etching process, such as reactive-ion etching (RIE) or plasma etching, may be employed to transfer the pattern from the patterned resist layer 26 into the pad layers 22, 24 and, thereby, define a hardmask. The etching process, which may be conducted in a single etching step or multiple etching steps with different etch chemistries, removes portions of the pad layers 22, 24 visible through the pattern in the patterned resist and stops vertically on the top surface 13 of semiconductor layer 12. After etching is concluded, resist layer 26 is stripped from the pad layers 22, 24 by, for example, plasma ashing or a chemical stripper.

The pattern is then transferred from the patterned pad layers 22, 24 of the hardmask into the underlying semiconductor layer 12. The transfer may be accomplished using an anisotropic dry etching process such as, for example, a RIE or a plasma etching process. In one embodiment, an etch chemistry (e.g., a standard silicon RIE process) is employed to extend the pattern through the semiconductor layer 12 that removes the constituent semiconductor material selective to (i.e., with a significantly greater etch rate than) the materials constituting the pad layers 22, 24 and that stops on the buried insulating layer 14. As a result, the semiconductor layer 12 is patterned to the depth of the buried insulating layer 14.

The semiconductor fin 36 has a geometrical shape of constituent sub-features characterized by graduated or modulated widths that matches the respective overlying linear feature 28 in the patterned resist layer 26. Specifically, semiconductor fin 36 includes a series of spaced-apart relatively narrow sections, such as the representative narrow sections 37, 38. The narrow sections 37, 38 are spatially correlated with and underlie the narrow sections 30 of the linear feature 28 of resist layer 26 (FIG. 1). Semiconductor fin 36 also includes a series of tapered sections, such as the representative tapered sections 39, 40, 41, that are spatially correlated with and underlie the tapered sections 32 of the linear feature 28 of resist layer 26. Semiconductor fin 36 also includes a series of relatively wide sections, such as the representative relatively wide sections 42, 43, joined in continuity with the narrow sections 38 and tapered sections 40. The wide sections 42 are spatially correlated with and underlie the wide sections 34 of the linear feature 28 of resist layer 26.

The sections 38-43 are distributed along the length of the semiconductor fin 36. The narrow sections 37, 38 and wide sections 42, 43 of the semiconductor fin 36 are arranged such that wide section 42 is disposed between the adjacent narrow sections 37, 38 and wide section 43 is disposed between narrow section 38 and an adjacent narrow section (not shown). Each narrow section 37, 38 is characterized by a constant width, $W_3$, measured between the sidewalls 44, 46 and each of the wide sections 42, 43 is characterized by a constant width, $W_4$, likewise measured between the sidewalls 44, 46. The width $W_4$ of the wide sections 42, 43 is greater than the width $W_3$ of the narrow sections 37, 38. The tapered sections 39, 40, 41 provide dimensional transitions between the width, $W_3$, of the narrow sections 37, 38 and the width, $W_4$, of the wide sections 42, 43. By definition, the tapered sections 39, 40, 41 have a width that is narrower than the width $W_4$ of the wide sections 42, 43.

The semiconductor fin 36 includes opposite sidewalls 44, 46 that extend from the top surface 13 to the buried insulating layer 14. The opposite sidewalls 44, 46 are substantially parallel to each other and perpendicular to the top surface 13 because of the directionality of the anisotropic etching process. The opposite sidewalls 44, 46 are oriented substantially perpendicular to the top surface 13 of semiconductor fin 36 and to the buried insulating layer 14. The initial thickness of the semiconductor layer 12 determines the height, h, of the semiconductor fins 36. The distance between the opposite sidewalls 44, 46 varies between the widths $W_3$ and $W_4$ along the length of semiconductor fin 36 because of the width modulation. The widths of the sections 38-43 are measured in a transverse direction relative to the sidewalls 44, 46 of the semiconductor fin 36.

Semiconductor fin 36 is doped with an impurity 48 that, when activated, is effective to increase the electrical conductivity of the constituent semiconductor material. If the semiconductor fin 36 is used for forming n-type field effect transistors, semiconductor fin 36 may be doped with a p-type impurity 48, such as boron (B), indium (In), or gallium (Ga). Alternatively, the semiconductor fin 36 may be doped with an n-type impurity 48, such as arsenic (As), phosphorus (P), or antimony (Sb), for use in forming p-type field effect transistors. The impurity 48 may be introduced into semiconductor fin 36 by an angled ion implantation process, or by another technique for doping semiconductor material with an impurity, as understood by a person having ordinary skill in the art.

In one embodiment, the impurity 48 is introduced into the sidewalls 44, 46 of semiconductor fin 36 by an angled ion implantation process. An ensuing high-temperature anneal activates and distributes the impurity 48 throughout the semiconductor material of the semiconductor fin 36 and may also alleviate any crystal damage introduced by the ion implantation process.

The concentration of impurity 48 is selected in conjunction with widths $W_3$ and $W_4$ such that, when biased during device operation, the semiconductor material of at least a portion of each tapered section 39, 40, 41 of semiconductor fin 36 is fully depleted, and at least a portion of each wide section 42, 43 of semiconductor fin 36 is partially depleted. The doping in the narrow sections 37, 38 of semiconductor fin 36 affects the threshold voltage of the subsequently formed field effect transistor. A typical concentration for impurity 48 in the semiconductor material may be approximately $1 \times 10^{19}$ cm$^{-3}$.

Figure 3A:
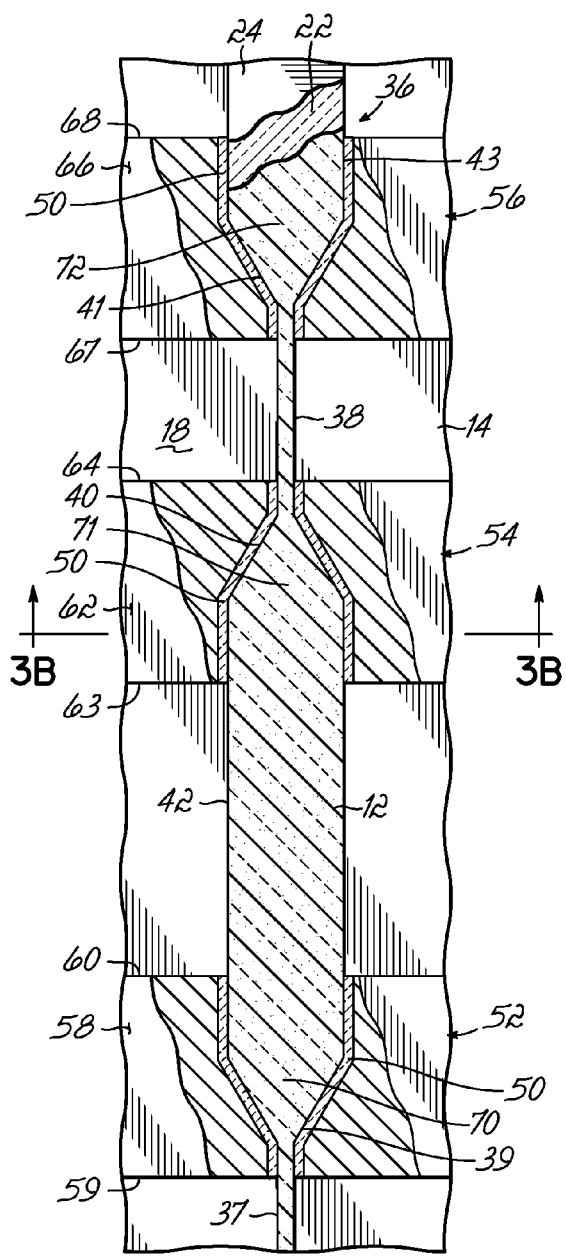
FIG. 3A is diagrammatic top view of the substrate portion at a fabrication stage subsequent to FIG. 2A.
Figure 3B:
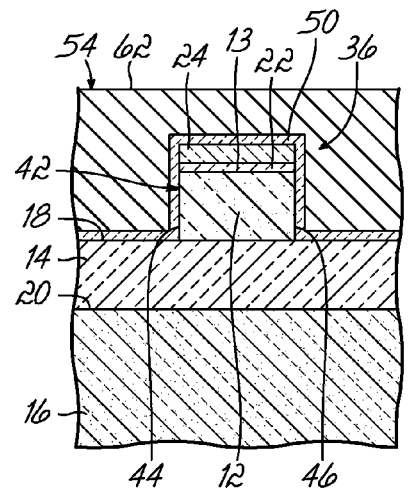
FIG. 3B is a diagrammatic cross-sectional view taken generally along line 3B-3B of FIG. 3A.

With reference to FIGS. 3A and 3B in which like reference numerals refer to like features in FIGS. 2A and 2B, respectively, and at a subsequent fabrication stage, a gate dielectric layer 50 is formed on the sidewalls 44, 46 of semiconductor fin 36 and adjacent semiconductor fins (not shown). The gate dielectric layer 50 may comprise any suitable dielectric or insulating material like silicon dioxide, silicon oxynitride, a high-k dielectric material such as hafnon (HfSiO$_4$), or combinations of these materials. The dielectric material constituting gate dielectric layer 50 may have a thickness between about 1 nm and about 10 nm. The gate dielectric layer 50 may be formed by a CVD process, a physical vapor deposition (PVD) process, thermal reaction of the semiconductor material of semiconductor fin 36 with a reactant, an atomic layer deposition process (ALD) or a combination of these techniques.

Gate electrodes, such as the representative gate electrodes 52, 54, 56, are formed across the SOI substrate 10 from a layer of a gate conductor material that is deposited on the buried insulating layer 14 such that semiconductor fin 36 is covered. The gate conductor material may be, for example, doped polysilicon, a silicided gate conductor comprising polysilicon capped with a suicide containing a metal like nickel (Ni) or cobalt (Co), a metal such as tungsten (W), molybdenum (Mo), or tantalum (Ta), or any other refractory metal, or any other appropriate material deposited by a CVD process, a PVD process, etc. The layer of gate conductor material is covered by a hardmask, which is patterned using photolithography. An anisotropic etching process relies on the hardmask to remove portions of the layer of gate conductor material to define gate electrodes 52, 54, 56. The etching process also removes the gate insulator layer 50 from sections of semiconductor fin 36 not covered by the gate electrodes 52, 54, 56. Residual portions of the gate dielectric layer 50 separate the sidewalls 44, 46 of semiconductor fin 36 from the gate electrodes 52, 54, 56. The pad layers 22, 24 and the gate dielectric layer 50 are disposed between the top surface 13 of the semiconductor fin 36 and the gate electrodes 52, 54, 56. The etching process, which stops on the buried insulating layer 14, selectively removes portions of the layer of gate conductor material and gate dielectric layer 50 without removing the semiconductor material contained in semiconductor fin 36.

Gate electrode 52 includes a top surface 58 and sidewalls 59, 60 that extend from the top surface 58 to intersect the buried insulating layer 14. Similarly, gate electrode 54 includes a top surface 62 and sidewalls 63, 64 that extend from the top surface 62 to intersect the buried insulating layer 14. Gate electrode 56 likewise includes a top surface 66 and sidewalls 67, 68 that extend from the top surface 66 to intersect the buried insulating layer 14. The top surfaces 58, 62, 66 are illustrated as overlapping the top surface 13 of semiconductor fin 36.

Gate electrode 52 intersects the semiconductor fin 36 along a channel 70 and, in the representative embodiment, partially overlaps narrow section 37, wide section 42, and tapered section 39. Gate electrode 54 intersects the semiconductor fin 36 along a channel 71 and, in the representative embodiment, partially overlaps narrow section 38, wide section 42, and tapered section 40. Gate electrode 54 intersects the semiconductor fin 36 along a channel 72 and, in the representative embodiment, partially overlaps narrow section 38, wide section 43, and tapered section 41.

Figure 3C:
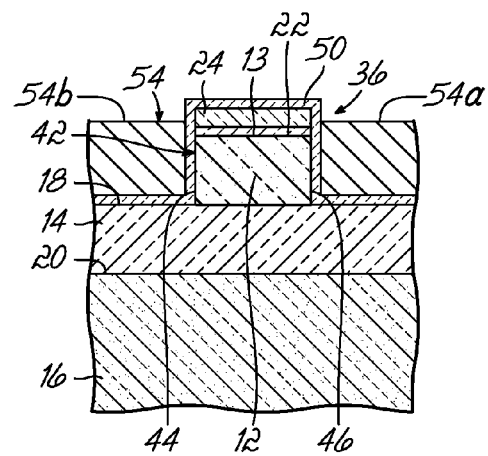
FIG. 3C is a diagrammatic cross-sectional view similar to FIG. 3B and in accordance with an alternative embodiment.

In an alternative embodiment, the thickness of the gate electrodes 52, 54, 56 may be reduced to be less than the height of the semiconductor fin 36. As a result, each of the gate electrodes 52, 54, 56 is divided into two distinct electrically disconnected gates separated by the width of the semiconductor fin 36 (i.e., the distance between the sidewalls 44, 46). Because of the thickness reduction, the gate electrodes 52, 54, 56 will not overlap the semiconductor fin 36. For example, gate electrode 54 may be reduced in thickness, as indicated in FIG. 3C, such that gate electrode 54 has two portions 54a, 54b that are not electrically coupled. Portion 54a may be employed as a back gate for transferring charge to and from the floating charge-neutral region 112 (FIG. 7) and portion 54b may be utilized as a wordline in the device construction.

Figure 4A:
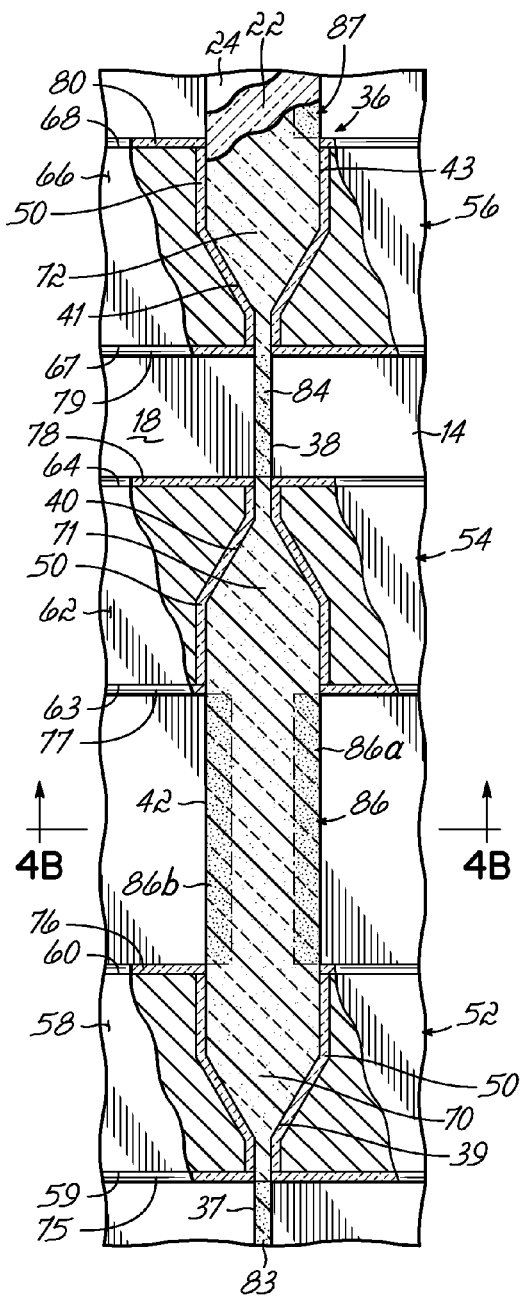
FIG. 4A is diagrammatic top view of the substrate portion at a fabrication stage subsequent to FIG. 3A.
Figure 4B:
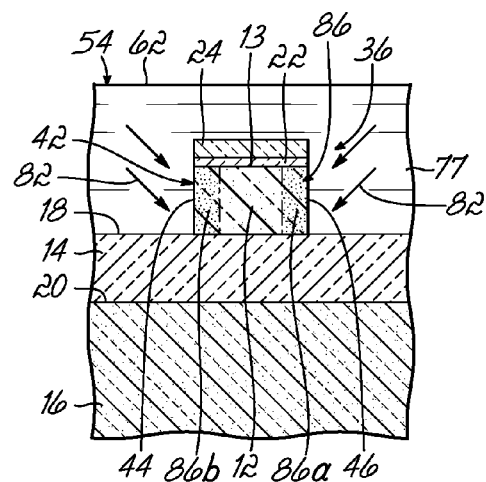
FIG. 4B is a diagrammatic cross-sectional view taken generally along line 4B-4B of FIG. 4A.

With reference to FIGS. 4A and 4B in which like reference numerals refer to like features in FIGS. 3A and 3B, respectively, and at a subsequent fabrication stage, dielectric spacers 75, 76 are formed on the sidewalls 59, 60 of the gate electrode 52 and extend from a top surface of gate electrode 52 to the buried insulating layer 14. Similarly, dielectric spacers 77, 78 are formed on the sidewalls 63, 64 of the gate electrode 54 and dielectric spacers 79, 80 are formed on the sidewalls 63, 64 of the gate electrode 56. Dielectric spacers 77-80 each extend from a top surface of the respective gate electrode 54, 56 to the buried insulating layer 14. The dielectric spacers 75-80 may originate from a conformal layer (not shown) of an electrically insulating material, such as about 10 nanometers to about 50 nanometers of $Si_3N_4$ deposited by CVD, that is shaped by a directional anisotropic etching process that preferentially removes the conformal layer from horizontal surfaces.

Portions of the semiconductor fin 36, which are exposed by the gate electrodes 52, 54, 56, are doped with a concentration of an impurity 82 that has a conductivity type opposite to the impurity 48 (FIG. 2). The impurity 82 may comprise As, P, or Sb for n-type device structures or, for p-type device structures, B, In, or Ga. The concentration of impurity 82 in the exposed portion of each narrow section 37, 38 is effective to impart a conductivity characteristic of drains 83, 84 of a field effect transistor. The concentration of impurity 82 in the exposed portion of each wide section 42, 43 is effective to impart a conductivity characteristic of sources 86, 87 of a field effect transistor. Source 86 includes a first portion 86a containing the impurity 82 that is located proximate to sidewall 44 and a second portion 86b containing the impurity 82 that is located proximate to sidewall 46. Similarly, source 87 includes a first portion 87a containing the impurity 82 that is located proximate to sidewall 44 and a second portion 87b containing the impurity 82 that is located proximate to sidewall 46.

The impurity 82 is introduced into the sidewalls 44, 46 with a limited range so that the sources 86, 87 do not extend completely across the width of the wide sections 42, 43. As a result, a width of the semiconductor fin 36 between the portions 86a, 86b of source 86 is not doped with impurity 82. Similarly, a width of the semiconductor fin 36 between the portions 87a, 87b of source 87 is not doped with impurity 82. Instead, these widths of the semiconductor fin 36 have a conductivity characteristic of impurity 48 (FIGS. 2A, 2B), which is opposite in conductivity type to impurity 82.

The impurity 82 may be introduced into the semiconductor fin 36 by angled ion implantation, followed by a high-temperature anneal to activate the impurity and to alleviate any damage introduced by the implantation process. For example, an appropriate dose for the implanted impurity 82 may be about $5 \times 10^{15}$ $cm^{-2}$. Because of the high impurity concentration, the source and drains 83, 84, 86, 87 have a degenerate level of doping such that the constituent semiconductor material has conductive character or, in other words, a character that is more similar to a conductor than a semiconductor. Therefore, regardless of operating or bias conditions, the source and drains 83, 84, 86, 87 are electrically conducting. Collectively, the pad layers 22, 24 have a thickness adequate to operate as an implant mask for the top surface 13 of the semiconductor fin 36, which helps to preserve the integrity of the floating bodies as described below. Optionally, extension and halo implants may be performed into the channels 70-72.

Figure 5A:
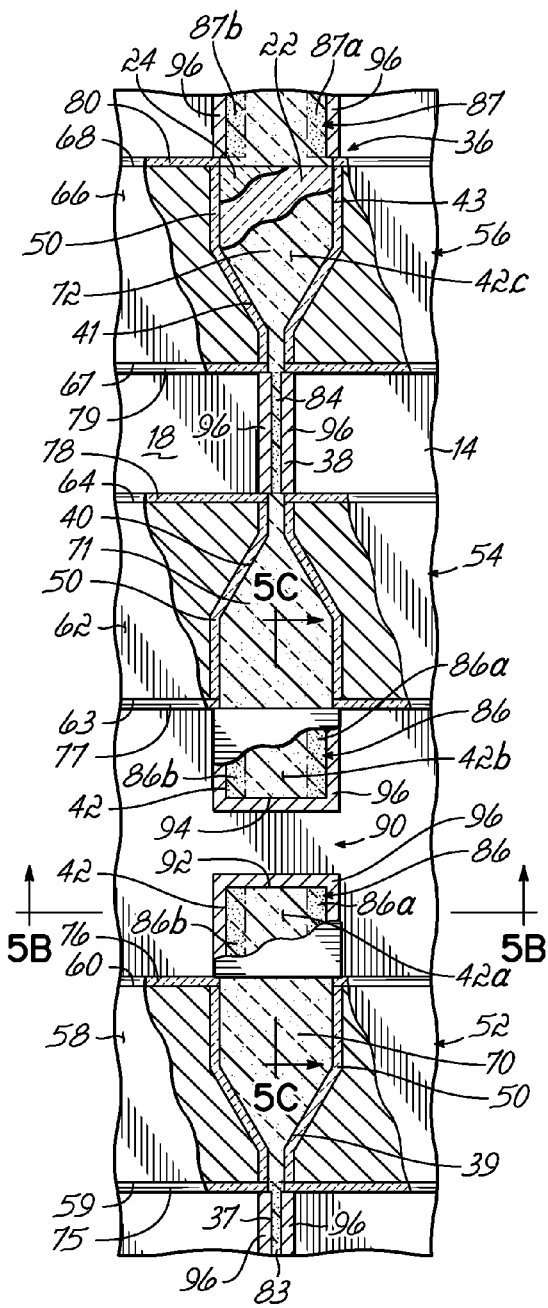
FIG. 5A is diagrammatic top view of the substrate portion at a fabrication stage subsequent to FIG. 4A.
Figure 5B:
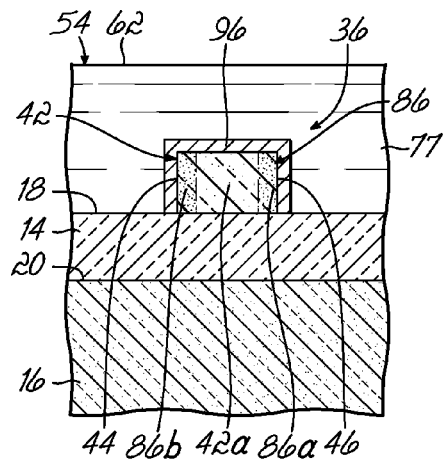
FIG. 5B is a diagrammatic cross-sectional view taken generally along line 5B-5B of FIG. 5A.
Figure 5C:
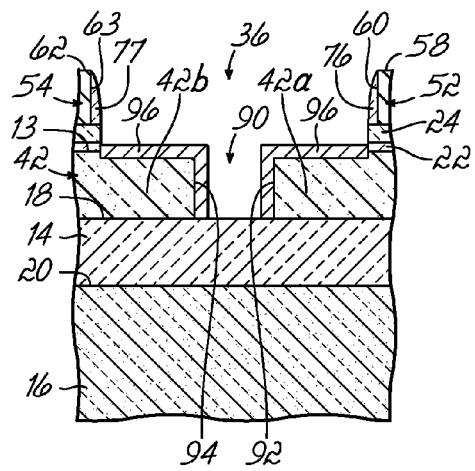
FIG. 5C is a diagrammatic cross-sectional view taken generally along line 5C-5C of FIG. 5A.

With reference to FIGS. 5A-5C in which like reference numerals refer to like features in FIGS. 4A and 4B, respectively, and at a subsequent fabrication stage, linear features, such as the representative linear feature in wide section 42 generally indicated by reference numeral 90, are defined in the wide sections 42, 43 of the semiconductor fin 36. Linear feature 90 forms a discontinuity in the wide section 42 of semiconductor fin 36 that physically separates the wide section 42 to define distinct semiconductor bodies 42a, 42b. A similar linear feature (not shown) is formed in wide section 43. Source 86, which is divided by the linear feature 90, is still shared by the semiconductor bodies 42a, 42b. As explained below, both portions of the divided source 86 are coupled with a shared electrical contact and, therefore, are coupled electrically in the final device structure. Another semiconductor body 42c shares drain 84 with semiconductor body 42b. In addition, another semiconductor body (not shown) of an adjacent wide section (not shown) shares drain 83 with semiconductor body 42a.

In one embodiment, the linear feature 90 may be formed by a standard lithography and etching process familiar to a person having ordinary skill in the art that removes a strip of the constituent semiconductor material in each wide section 42 extending from one of the sidewalls 44 to the opposite sidewall 46. The etching process stops on the buried insulating layer 14 so that the linear feature 90 extends vertically from the top surface 13 to the buried insulating layer 14, as best shown in FIG. 5C. A sidewall 92 of semiconductor body 42a confronts a sidewall 94 of semiconductor body 42b.

The pad layers 22, 24 are removed from the semiconductor bodies 42a, 42b, 42c by a separate wet chemical etch process selective to the material constituting the semiconductor fin 36. For example, the wet chemical etch process may entail sequentially exposing the pad layers 22, 24 to a heated etchant solution of phosphoric acid effective to remove nitride and an etchant solution of hydrofluoric acid effective to remove oxide.

A silicide layer 96 is formed on the top surface 13 and sidewalls 44, 46 of the semiconductor fin 36 not covered by the gate electrodes 52, 54, 56 and dielectric spacers 75-80 by a silicidation process familiar to a person having ordinary skill in the art. The silicide layer 96 provides a low resistance contact to the semiconductor material constituting the semiconductor fin 36.

In one representative silicidation process, the silicidation process forming silicide layer 96 includes depositing a layer of suitable metal, such as nickel (Ni), cobalt (Co), tungsten (W), titanium (Ti), etc., across the SOI substrate 10 and then subjecting the metal-coated SOI substrate 10 to a high temperature anneal by, for example, a rapid thermal annealing process. During the high temperature anneal, the metal reacts with the silicon-containing semiconductor material (e.g., silicon) of the semiconductor fin 36 to form the silicide layer 96. The annealing phase of the silicidation process may be conducted in an inert gas atmosphere or in a nitrogen-rich gas atmosphere, and at a temperature of about 350° C. to about 800° C. contingent upon the type of metal silicide being considered. Following the high temperature anneal, unreacted metal remains on the buried insulating layer 14, the dielectric spacers 75-80, and the gate electrodes 52, 54, 56 (i.e., where the deposited metal is not in contact with a silicon-containing material). Unreacted metal is selectively removed using, for example, an isotropic wet chemical etch process.

Figure 6A:
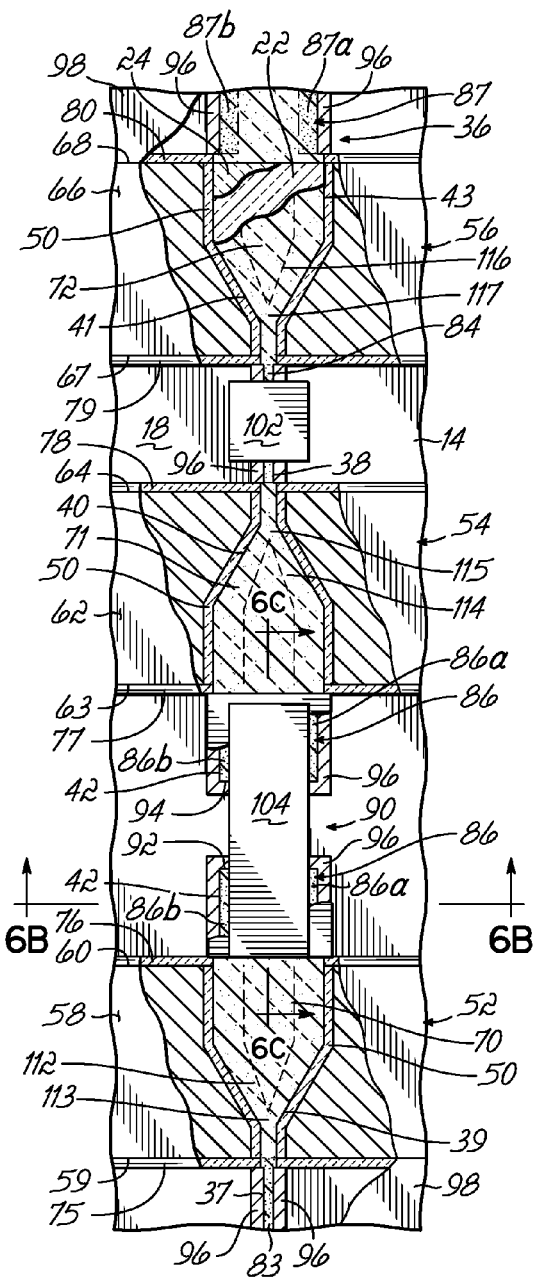
FIG. 6A is diagrammatic top view of the substrate portion at a fabrication stage subsequent to FIG. 5A.
Figure 6B:
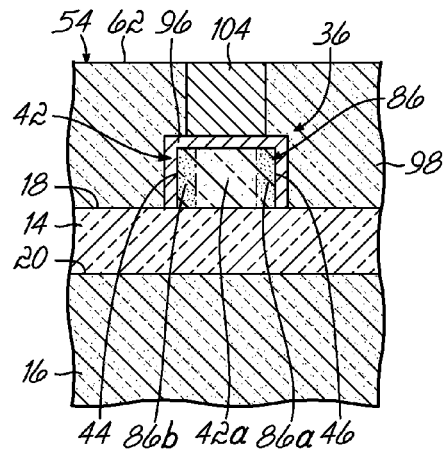
FIG. 6B is a diagrammatic cross-sectional view taken generally along line 6B-6B of FIG. 6A.
Figure 6C:
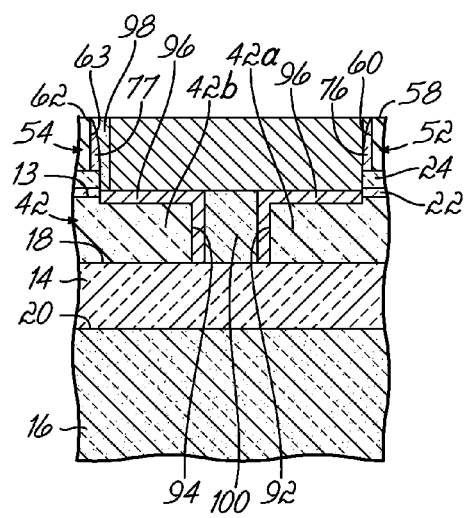
FIG. 6C is a diagrammatic cross-sectional view taken generally along line 6C-6C of FIG. 6A.

With reference to FIGS. 6A-C in which like reference numerals refer to like features in FIGS. 5A-C, respectively, and at a subsequent fabrication stage, a blanket layer 98 of an insulating material is applied across the SOI substrate 10 and planarized by a conventional planarization process like chemical mechanical planarization (CMP). The insulating material of the blanket layer 98, which supplies an interlayer dielectric, may be composed of a spin-on glass (SOG) material applied by coating the SOI substrate 10 with SOG material in liquid state, spinning the SOI substrate 10 at high speeds to uniformly distribute the liquid on the surface by centrifugal forces, and baking at a low temperature to solidify the SOG material. Alternatively, the insulating material of the blanket layer 98 may include multiple coatings of different dielectric materials as understood by a person having ordinary skill in the art.

A portion of the dielectric material of blanket layer 98 fills the linear feature 90 to define an isolation region 100 between the confronting sidewalls 92, 94 of semiconductor bodies 42a, 42b. The isolation region 100 is characterized by a "mesa-type" appearance familiar to a person having ordinary skill in the art. The isolation region 100 electrically isolates adjacent semiconductor bodies 42a, 42b from each other. Additional isolation regions (not shown), each substantially identical to isolation region 100, electrically isolate other semiconductor bodies (not shown) of the semiconductor fin 36 from reach other.

Electrical contacts to the drains 83, 84, such as the representative electrical contact defined by plug 102 to drain 84, are defined in the blanket layer 98. Electrical contacts to the sources 86, 87, such as the representative electrical contact defined by plug 104 to source 86, are concurrently defined in the blanket layer 98. Plug 102 is electrically coupled with a sense line in one of the metallization levels (not shown). Plug 104 is electrically coupled with a bit line in one of the metallization levels (not shown). In one embodiment, the plugs 102, 104 are formed by lithographically patterning the blanket layer 98 in a conventional manner to form vias to the drains 83, 84 and to the sources 86, 87. Plugs 102, 104 are formed into the vias using a conventional deposition technique, such as CVD or plating, that deposits conductive material in the vias and a chemical mechanical polishing (CMP) process that removes excess conductive material. Suitable conductive materials include, but are not limited to, doped polysilicon, a silicide (e.g., WSi), or metals such as tungsten (W), copper (Cu), aluminum (Al), gold (Au), and alloys thereof deposited by evaporation, sputtering, or other known deposition techniques.

Figure 7:
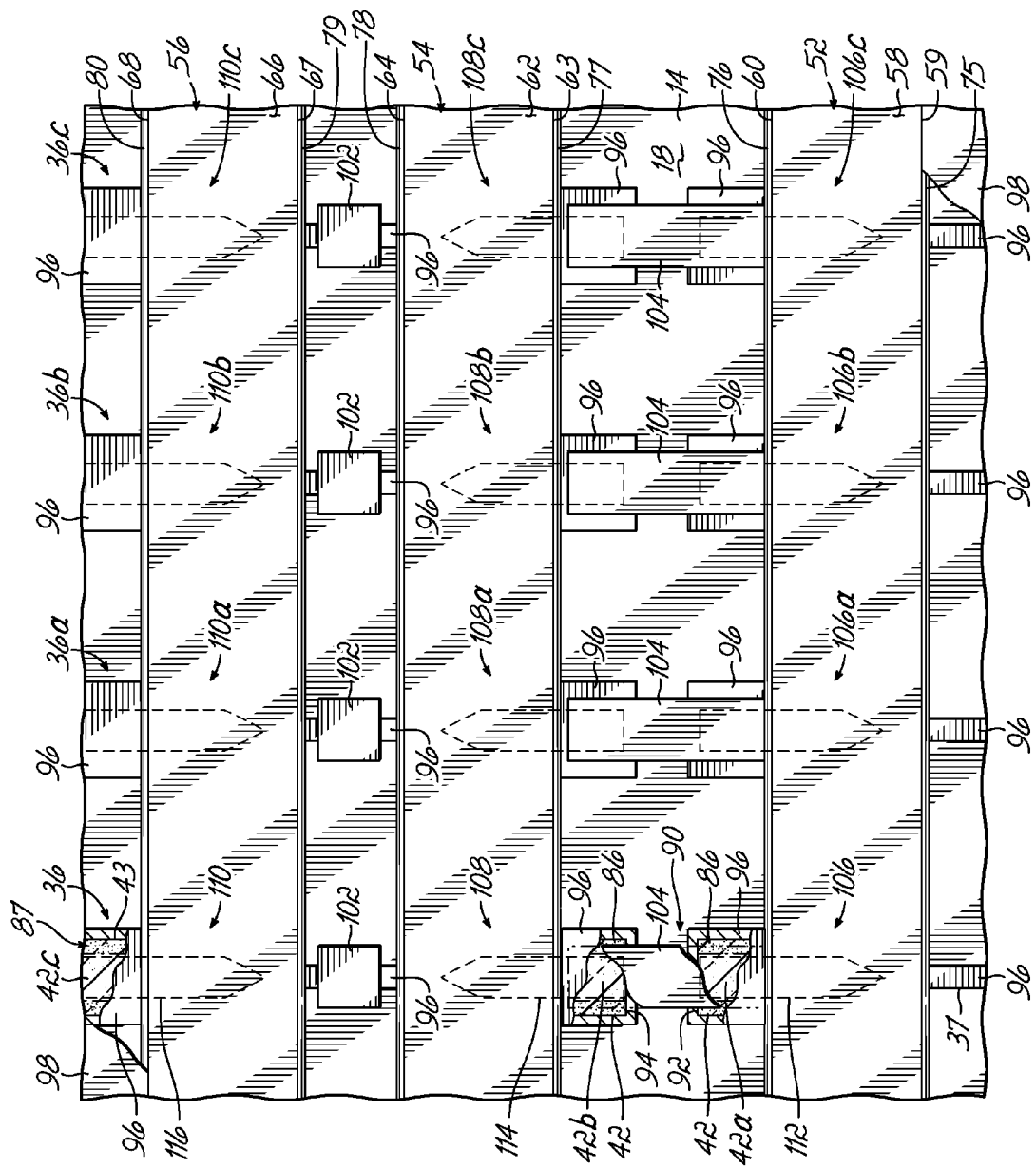
FIG. 7 is diagrammatic top view showing an array of the semiconductor device structures of FIG. 6A distributed across a larger-area portion of the substrate.

With reference to FIG. 7 in which like reference numerals refer to like features in FIGS. 6A-6C, the semiconductor fin 36 contains a one-dimensional, linear array of semiconductor bodies, such as the representative semiconductor bodies 42a, 42b, 42c, that are functional as semiconductor device structures, which are indicated generally by reference numerals 106, 108, 110. Each of the semiconductor bodies 42a, 42b, 42c includes, when biased during operation, a respective floating charge-neutral region 112, 114, 116. The floating charge-neutral regions 112, 114, 116, when the semiconductor bodies 42a, 42b, 42c are biased during device operation, represent charge neutral volumes of semiconductor material or floating bodies that exist in semiconductor fin 36 as a consequence of partial depletion of carriers. The charge neutral volumes of the floating charge-neutral regions 112, 114, 116 are located between the sidewalls 44, 46 and between the top surface 13 of the semiconductor fin 36 and the dielectric layer 14.

Floating charge-neutral region 112 is located in semiconductor body 42a between the source 86 and drain 83 in semiconductor fin 36 and at least partially underlies gate electrode 52 in sections 39 and 42. Located between the floating charge-neutral region 112 and the drain 83 is a region 113 that is fully depleted when the semiconductor body 42a is biased. Floating charge-neutral region 114 is located in semiconductor body 42a between source 86 and drain 83 in semiconductor fin 36 and at least partially underlies gate electrode 54 in sections 40 and 42. Located between the floating charge-neutral region 114 and the drain 84 is a region 115 that is fully depleted when the semiconductor body 42b is biased. Floating charge-neutral region 116 is located in semiconductor body 42c between source 87 and drain 84 and at least partially underlies gate electrode 56 in sections 41 and 43. Located between the floating charge-neutral region 116 and the drain 84 is a region 117 that is fully depleted when the semiconductor body 42c is biased.

The fully-depleted regions 113, 115, 117 represent volumes of semiconductor material doped with impurity 48 (FIGS. 2A, 2B) at a concentration and with a width selected to provide full depletion when biased and define channel regions for carrier flow between the corresponding source and drain. The floating charge-neutral regions 112, 114, 116 represent volumes of semiconductor material doped with impurity 48 (FIGS. 2A, 2B) at a concentration and with a width selected to provide only partial depletion when biased. As the tapered section 39 of semiconductor body 42a narrows from the width $W_4$ to width $W_3$, the floating charge-neutral region 112 tapers to a tip at an intermediate width between $W_4$ and $W_3$ so as to transition to the fully-depleted region 113, which extends in the tapered section 39 at least between the intermediate width and width $W_3$. As the tapered section 40 of semiconductor body 42b narrows from the width $W_4$ to width $W_3$, the floating charge-neutral region 114 tapers to a tip at an intermediate width between $W_4$ and $W_3$ so as to transition to the fully-depleted region 115, which extends in the tapered section 40 between the intermediate width and width $W_3$. As the tapered section 41 of semiconductor body 42c narrows from the width $W_4$ to width $W_3$, the floating charge-neutral region 116 tapers to a tip at an intermediate width between $W_4$ and $W_3$ so as to transition to the fully-depleted region 117, which extends in the tapered section 41 between the intermediate width and width $W_3$.

Each of the floating charge-neutral regions 112, 114 may be at least partially located in the wide section 42 of the semiconductor fin 36 generally between the two portions 86a, 86b of the source 86, as shown in FIGS. 6A and 7. Similarly, the floating charge-neutral region 116 may be at least partially located in the wide section 43 of the semiconductor fin 36 generally between the two portions 87a, 87b of the source 87, as also shown in FIGS. 6A and 7. The widths of these portions of the floating charge-neutral regions 112, 114, 116 in the wide sections 42, 43 of the semiconductor fin 36 may be constant over their length, as depicted in FIGS. 6A and 7.

Chevron-shaped portions of the floating charge-neutral regions 112, 114, 116 are present in the respective tapered sections 39, 40, 41. The chevron shape arises from the narrowing of the sidewalls 44, 46 in tapered sections 39, 40, 41 to a width that results in full depletion. Accordingly, fully-depleted region 113 intervenes between the tip of the chevron-shaped portion of the floating charge-neutral region 112 and the narrow section 37, which includes the drain 83. Fully-depleted region 115 intervenes between the tip of the chevron-shaped portion of floating charge-neutral region 114 and the narrow section 38, which includes the drain 84. Fully-depleted region 117 intervenes between the tip of the chevron-shaped portion of floating charge-neutral region 116 and the narrow section 38, which includes the drain 84.

The floating charge-neutral regions 112, 114, 116 develop during device operation because the semiconductor fin 36 is only partially depleted in at least a portion of the wide sections 42, 43 and an adjacent portion of an adjoining one of the tapered sections 39, 40, 41 because of the combination of the width and doping concentration. Consequently, the semiconductor device structures 106, 108, 110 include fin-type field effect transistors (FinFETs) and floating charge-neutral regions 112, 114, 116 used for charge storage so that the semiconductor device structures 106, 108, 110 can operate as individual memory cells.

As apparent from FIG. 7, the semiconductor device structures 106, 108, 110 are replicated across the SOI substrate 10 during the fabrication process. An adjacent set of semiconductor device structures 106a, 108a, 110a, which are similar to semiconductor device structures 106, 108, 110, are formed using an adjacent semiconductor fin 36a, which is similar to semiconductor fin 36. An adjacent set of semiconductor device structures 106b, 108b, 110b, which are similar to semiconductor device structures 106, 108, 110, is formed using an adjacent semiconductor fin 36b, which is similar to semiconductor fin 36. An adjacent set of semiconductor device structures 106c, 108c, 110c, which are similar to semiconductor device structures 106, 108, 110, is formed using an adjacent semiconductor fin 36c which is similar to semiconductor fin 36. Additional semiconductor device structures (not shown) are formed along the length of each the semiconductor fins 36, 36a-c and additional semiconductor fins (not shown), each including additional semiconductor device structures (not shown), may be located in a flanking relationship with semiconductor fins 36, 36a-c so as to define a memory cell array.

Standard processing follows, which includes metallization for the M1 level interconnect wiring, and interlayer dielectric layers, conductive vias, and metallization for upper level (M2-level, M3-level, etc.) interconnect wiring. Metallization in one of the upper levels of interconnect wiring establishes electrical contacts with the gate electrodes 52, 54, 56.

The isolation region 100 between the semiconductor bodies 42a, 42b of the semiconductor fin 36 may be established by alternative types of structures, as described below.

Figure 8A:
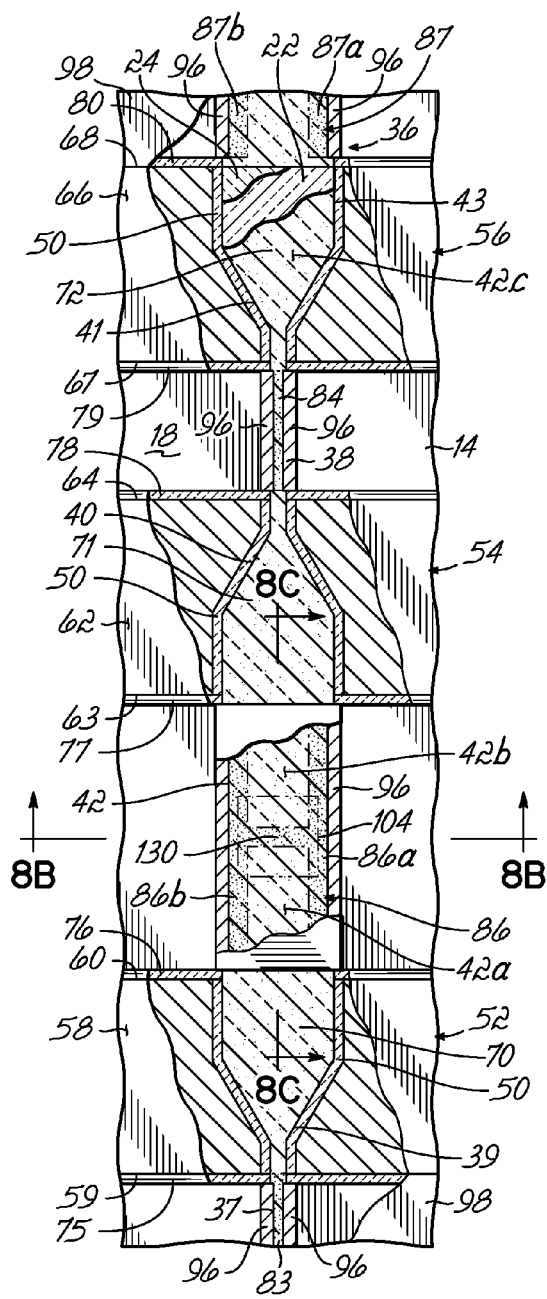
FIG. 8A is diagrammatic top view of the substrate portion similar to FIG. 6A, but in accordance with an alternative embodiment of the invention.
Figure 8B:
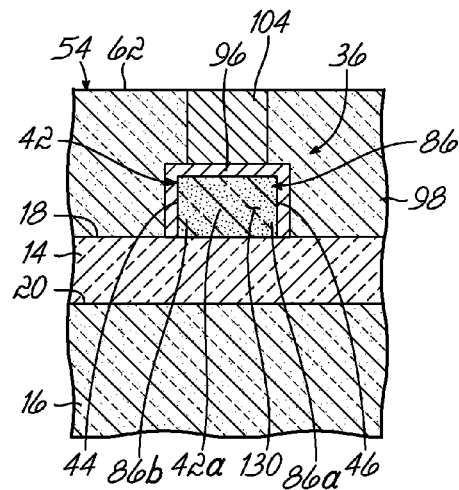
FIG. 8B is a diagrammatic cross-sectional view taken generally along line 8B-8B of FIG. 8A.
Figure 8C:
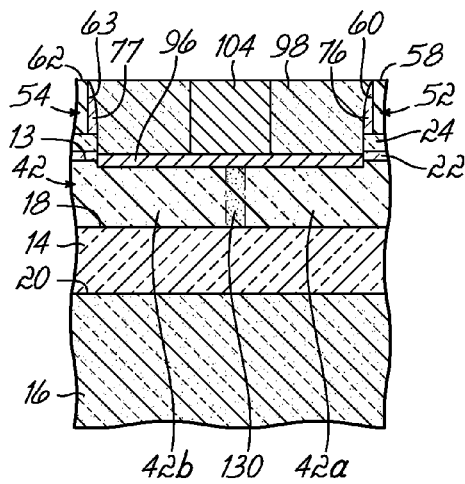
FIG. 8C is a diagrammatic cross-sectional view taken generally along line 8C-8C of FIG. 8A.

With reference to FIGS. 8A-C in which like reference numerals refer to like features in FIGS. 6A-C and in accordance with an alternative embodiment, an isolation region 130 is defined as a region of the semiconductor fin 36 doped to have the same conductivity type as the source 86. In this embodiment, the pad layers 22, 24 are removed from the top surface 13 of the semiconductor fin 36 before the impurity 82 is introduced into the semiconductor fin 36. A mask is applied to restrict the introduction of impurity 82 so that isolation region 130 is defined as a doped portion of the semiconductor fin 36 in the wide section 42 without also encroaching on the floating charge-neutral regions 112, 114, which are free of a significant concentration of impurity 82. The isolation region 130 bridges the two portions 96a,b of the source 86 formed along the sidewalls 44, 46. The isolation region 130 is therefore defined in the wide section 42 of semiconductor fin 36 as a junction-type isolation. Processing continues as described in connection with FIGS. 6A-C.

Figure 9A:
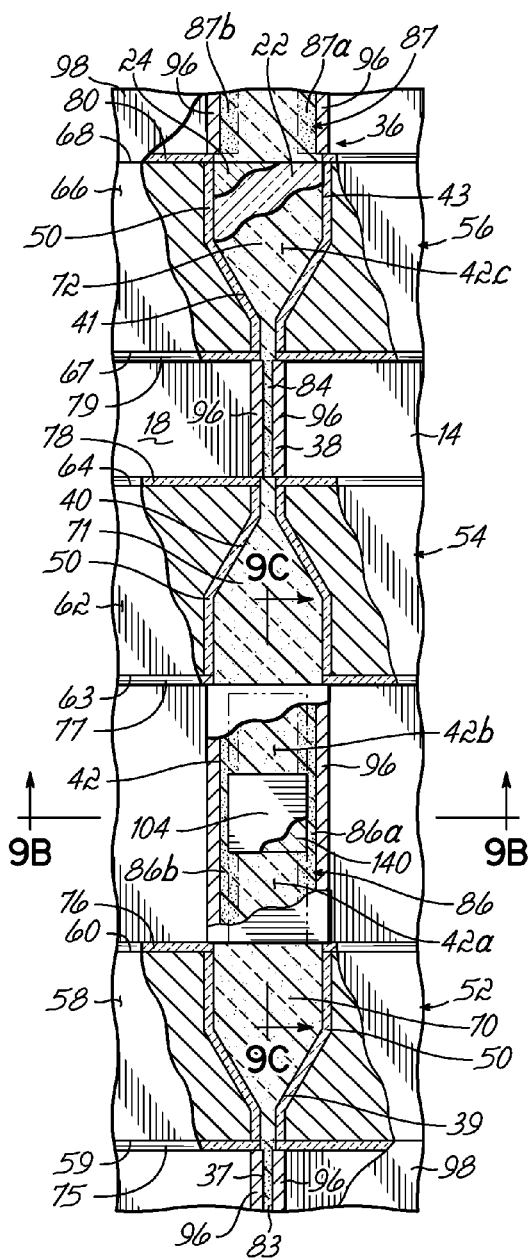
FIG. 9A is diagrammatic top view of the substrate portion similar to FIG. 6A, but in accordance with an alternative embodiment of the invention.
Figure 9B:
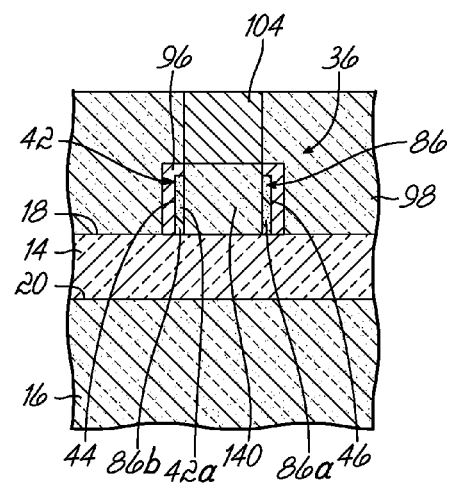
FIG. 9B is a diagrammatic cross-sectional view taken generally along line 9B-9B of FIG. 9A.
Figure 9C:
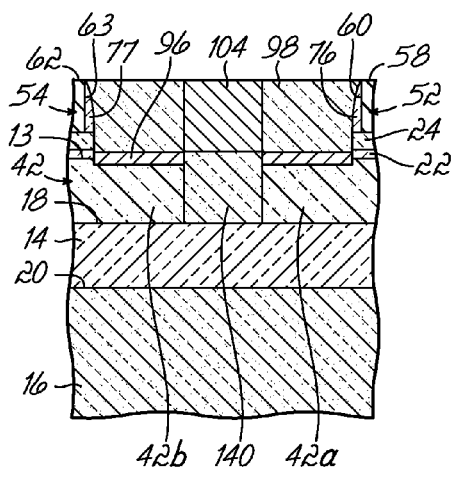
FIG. 9C is a diagrammatic cross-sectional view taken generally along line 9C-9C of FIG. 9A.

With reference to FIGS. 9A-C in which like reference numerals refer to like features in FIGS. 6A-C and in accordance with an alternative embodiment, an isolation region 140 is defined as a trench-type isolation in the wide section 42 of semiconductor fin 36. The isolation region 140 is formed by a standard lithography and etching process familiar to a person having ordinary skill in the art that defines an opening or via in the constituent semiconductor material in wide section 42. The etching process stops on the buried insulating layer 14 so that the gap extends from the top surface 13 to the buried insulating layer 14. However, portions of the doped semiconductor material of source 86 are preserved intact along each sidewall 44, 46 when the via is defined. In contrast to isolation region 100 (FIGS. 6A-C), isolation region 140 does not extend across the entire width of the semiconductor fin 36. Instead, the perimeter of the isolation region 140 is spaced inwardly from the sidewalls 44, 46. The via is filled by dielectric material originating from the blanket layer 98 that is applied to define the isolation region 140 between the adjacent semiconductor bodies 42a, 42b. Processing continues as described in connection with FIGS. 6A-C.

Figure 10:
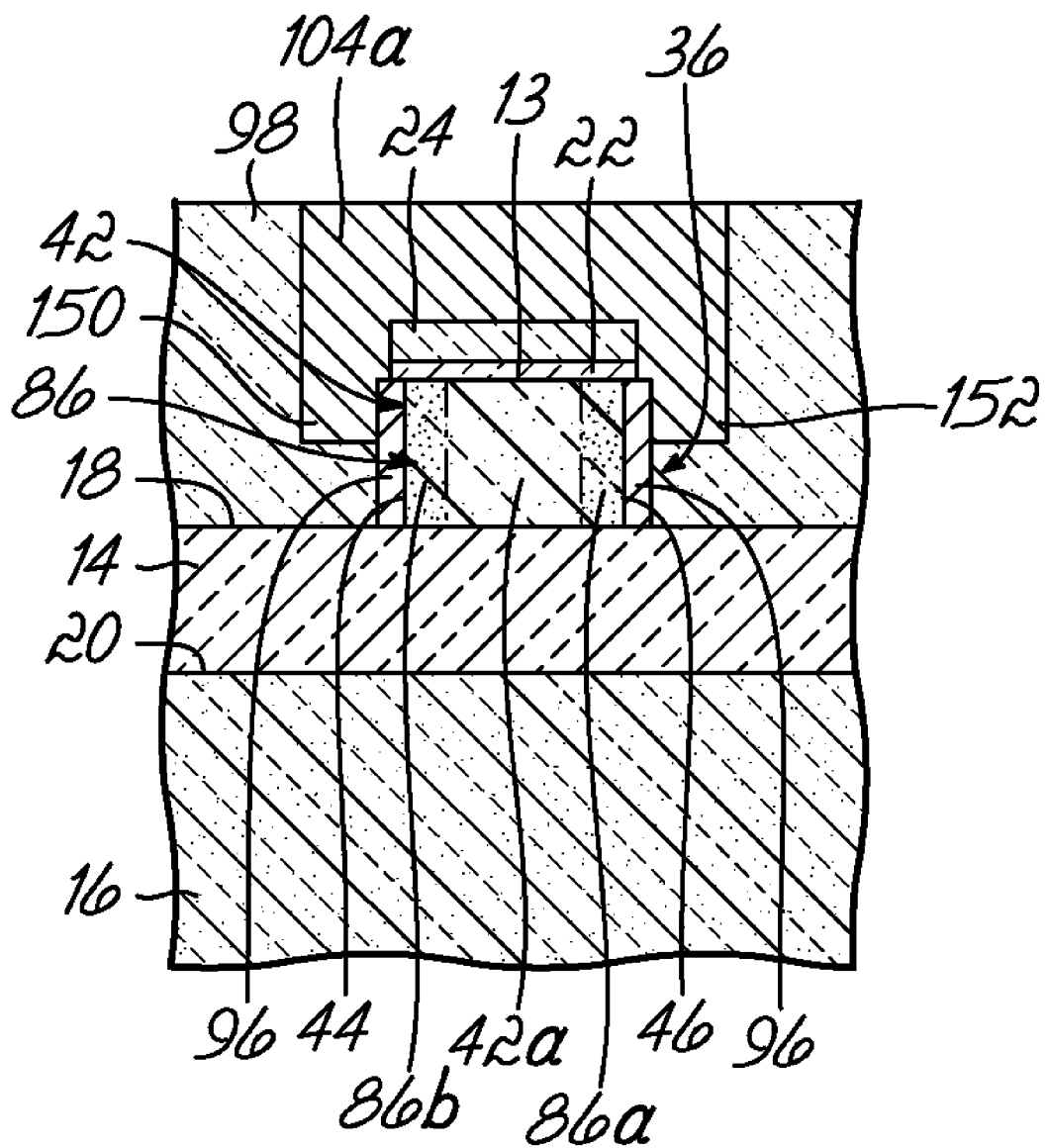
FIG. 10 is a diagrammatic cross-sectional view taken in a source of the semiconductor fin in accordance with an alternative embodiment of the invention.

With reference to FIG. 10 in which like reference numerals refer to like features in FIG. 6B and in accordance an alternative embodiment of the invention, the dielectric material of pad layers 22, 24 may be retained on the top surface 13 of the semiconductor fin 36 in the regions that define the sources 86, 87 and the drains 83, 84. An electrical contact in the form of a plug 104a, which is similar to plug 104 (FIG. 9A), includes portions 150, 152 that extend downwardly along the sidewalls 44, 46 so as to have a greater degree of overlap with the sidewalls 44, 46 than plug 104. The portions 150, 152 of plug 104a establish electrical contact with the silicide 96 on the sidewalls 44, 46 of the semiconductor fin 36 so that the electrical contact 104a is electrically coupled with both portions 86a, 86b of the source 86. Similar electrical contacts (not shown) are fabricated that are used to establish an electrical connection with source 87 and the drains 83, 84.

References herein to terms such as "vertical", "horizontal", etc. are made by way of example, and not by way of limitation, to establish a frame of reference. The term "horizontal" as used herein is defined as a plane parallel to a conventional plane of a semiconductor wafer or substrate, regardless of its actual three-dimensional spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the invention without departing from the spirit and scope of the invention. The term "on" used in the context of two layers means at least some contact between the layers. The term "over" means two layers that are in close proximity, but possibly with one or more additional intervening layers such that contact is possible but not required. As used herein, neither "on" nor "over" implies any directionality.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the invention. It is also understood that features of the invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of fabricating a semiconductor device structure using a semiconductor-on-insulator substrate having a semiconductor layer, a bulk semiconductor region underlying the semiconductor layer, and a dielectric layer between the semiconductor layer and the bulk semiconductor region, the method comprising:

patterning the semiconductor layer to define a semiconductor body with first and second sidewalls extending to the dielectric layer, the semiconductor body having a first section with a first constant width between the first and second sidewalls, a second section with second constant width between the first and second sidewalls, and a third section between the first and second sections;

forming a gate electrode having an arrangement relative to semiconductor body such that each of the first, second, and third sections of the semiconductor body is at least partially overlapped by the gate electrode; and introducing a first impurity of a first conductivity type into the first, second, and third sections of the semiconductor body with a first concentration selected in conjunction with the first width and the second width such that, when the first section is biased by a bias potential, the first and third sections are partially depleted and the second section of the semiconductor body is fully depleted to define a floating charge-neutral region in the first and third sections, wherein the first, second, and third sections are disposed along the length of the semiconductor body, the first constant width of the first section is wider than the second constant width of the second section, and the third section tapers from the first constant width of the first section to the second constant width of the second section.

2. The method of claim 1 further comprising:

introducing a second impurity of a second conductivity type opposite to the first conductivity type into the first section of the semiconductor body with a concentration effective to define a source that includes a first portion proximate to the first sidewall and a second portion proximate to the second sidewall so that the floating charge-neutral region is at least partially disposed between the first and second portions of the source; and introducing the second impurity into the second section of the semiconductor body to define a drain.

3. The method of claim 2 wherein the first section of the semiconductor body between the first and second portions of the source retains the first conductivity type after the second impurity is introduced, and further comprising:

forming an impurity-doped bridge extending across a portion of the first section of the semiconductor body to connect the first and second portions of the source, the bridge doped with a concentration of the second impurity.

4. The method of claim 1 further comprising:

forming an isolation region in the first section of the semiconductor body that extends from a top surface of the semiconductor body to the dielectric layer and between the first and second sidewalls.

5. The method of claim 4 wherein the isolation region is a dielectric-filled region that extends across the first width of the first section from the first sidewall to the second sidewall and from the top surface of the semiconductor body to the dielectric layer such that a first portion of the first section is divided from a second portion of the first section to electrically isolate the first and second portions of the first section.

6. The method of claim 4 wherein the isolation region is a doped region containing a second impurity of a second conductivity type opposite to the first conductivity type.

7. The method of claim 1 further comprising:
before the gate electrode is formed, forming a gate dielectric layer on the semiconductor body.

8. The method in claim 1 further comprising:
forming a source in the first section of the semiconductor body, the source doped with a second impurity having an opposite conductivity type to the first impurity.

9. The method of claim 8 wherein the semiconductor body has a top surface, and further comprising:
forming a dielectric pad layer on the top surface of the semiconductor body; and
forming a conductive plug electrically connected to the source, the conductive plug extending toward the dielectric pad layer and overlapping at least a portion of the first and second sidewalls.

10. The method of claim 1 wherein patterning the semiconductor layer to define the semiconductor body comprises:
forming a patterned mask on the semiconductor layer; and
etching to remove portions of the semiconductor layer exposed through the patterned mask.

* * * * *